United States Patent [19]

Gaudel et al.

[11] 4,038,831

[45] Aug. 2, 1977

[54] THERMOELECTRIC INSTALLATIONS

[75] Inventors: Gérard Gaudel, Pont-a-Mousson; Robert Krafft, Ermont, both of France

[73] Assignee: Air Industrie, Courbevoie, France

[21] Appl. No.: 698,345

[22] Filed: June 22, 1976

[30] Foreign Application Priority Data

June 27, 1975 France .................... 75.20343

[51] Int. Cl.² .................................. F25B 21/02
[52] U.S. Cl. .................................................. 62/3
[58] Field of Search ........................................ 62/3

[56] References Cited

U.S. PATENT DOCUMENTS

| 3,178,894 | 4/1965 | Mole et al. | 62/3 |
| 3,196,620 | 7/1965 | Elfving et al. | 62/3 |
| 3,213,630 | 10/1965 | Mole | 62/3 |
| 3,287,923 | 11/1966 | Elfving | 62/3 |
| 3,360,942 | 1/1968 | Elfuing | Elfving/3 |
| 3,561,224 | 2/1971 | Banks et al. | 62/3 |

*Primary Examiner*—Lloyd L. King
*Attorney, Agent, or Firm*—Lane, Aitken, Dunner & Ziems

[57] ABSTRACT

The invention relates to a thermoelectric installation, in particular to a heat pump.

This installation includes thermoelements mounted between thermal exchange walls belonging to hot exchangers through which a hot fluid circulates and cold exchangers through which a cold fluid circulates, said hot and cold exchangers alternating with thermoelements to form batteries arranged side by side or imbricated in such a way as to constitute a drawer of parallelepipedal appearance. A joint is provided at the level of each plane of thermoelements, this joint being constituted by a plate including the same number of apertures as there are thermoelements in said plane, this joint being nipped between the facing walls of the hot exchanger and of the cold exchanger and including, in addition, a peripheral rim acting in conjunction over the whole or part of its length with a bearing surface formed in the framework. A displacement mechanism is provided to produce a relative displacement between the drawer and the framework.

25 Claims, 10 Drawing Figures

THERMOELECTRIC INSTALLATIONS

The invention relates, in a general way, to thermoelectric installations comprising thermoelements (or thermoelectric elements) mounted between thermal exchange walls belonging to hot exchangers with a hot fluid or a fluid to be heated circulating through them and cold exchangers with a cold fluid or a fluid to be refrigerated circulating through them.

Such installations may be employed to produce a d.c. current when the thermal exchange walls are kept at different temperatures by the hot fluid and the cold fluid or, on the other hand, to maintain the thermal exchange walls at different temperatures in order to heat or to refrigerate one fluid relative to the other when the d.c. current flows through the thermoelements, being conducted to such elements by the heat exchangers.

The invention applies more particularly but not exclusively to installations of the latter type, the thermoelements being supplied with d.c. current in order to maintain a temperature difference between the thermal exchange walls. Such an installation, termed a "heat pump," may be employed for air-conditioning by heating or cooling a fluid relative to the surrounding atmosphere; in fact the thermoelements are of two types, that is thermoelements of type P which transfer calories in the direction of the current and thermoelements of the type N which transfer calories in the direction opposite to that of the current.

For the construction of thermoelectric installations it has already been suggested that they should include batteries of hot and cold heat exchangers alternating with thermoelements where the heat exchanger or exchangers which have the thermoelements on both sides may be electrically insulated or not and the batteries are arranged side by side or imbricated (according to the nature of the electrical connections between the thermoelements) in such a way as to constitute a drawer of parallelepipedal appearance in which the thermoelements are arranged in parallel planes and the heat exchangers face each other. The elements which make up such a drawer are held together by means of attachment and are protected by a framework.

Nevertheless in such an construction problems often arise in manufacture because there are, of course, a large number of thermoelements and it is necessary to arrange for a tight seal between the fluids which circulate through the exchangers, for the free expansion of certain parts of the installation, and for the assembly and dismounting of those parts of the installation which include the thermoelements.

The present invention has as its object a thermoelectric installation constructed in such a way that a tight seal between the fluids circulating through the exchangers is ensured by simple and reliable means, that the expansion of those parts of the installation which are subjected to temperature gradients is able to occur freely and that dismounting and assembly of those parts of the installation which include the thermoelements is simple and rapid.

According to the invention there are provided, a joint at the level of each plane of thermoelements, said joint being constituted by a plate having the same number of apertures as there are thermoelements in said plane, said joint being nipped between the facing walls of the hot exchanger and of the cold exchanger and including, in addition, a peripheral rim acting, over the whole or part of its length, in conjunction with a surface of application arranged in the framework, and a mechanism for displacement to produce a relative displacement between the drawer and the framework, said relative displacement allowing, either the placing of the peripheral rim of each joint in sealing contact with the corresponding surface of application of the framework (installation in operation), or the separation of the peripheral rim of each joint from the corresponding surface of application of the framework (drawer in the position for removal from the framework).

According to a first mode of embodiment of the invention the drawer is suspended in the upper part of the framework, the displacement mechanism being arranged so as to cause said drawer to assume, either a high position (installation in operation), or a low position (drawer in position for removal from the framework).

The peripheral rim of each joint may in this case take the form of a lip.

This displacement mechanism may advantageously be of a cam type.

According to a constructional arrangement of the invention there is provided a switching device so arranged as to command the flow of electric current to the thermoelements when the drawer is in the position corresponding to operation of the installation and to cut off the flow of electric current to the thermoelements when the drawer is in the position for removal.

According to another mode of embodiment of the invention the displacement mechanism is so arranged as to bring about a lateral translation movement of said drawer, the drawer being able either to be suspended in the upper part of the framework (lateral translation movement parallel to the upper part of the framework) or to lie on the lower part of the framework (lateral translation movement parallel to the lower part of the framework).

This displacement mechanism may advantageously be of a cam type operating in conjunction with nipples.

The invention consists, in addition to the devices listed above, in certain other devices which are preferably employed at the same time and which will be described more fully below.

The invention may, in any case, be understood by means of the descriptive supplement which follows as well as by means of the attached drawings where said supplement and said drawings relate to preferred modes of embodiment and construction of the invention and, of course, have no limiting character.

Finally.

Figure 1:
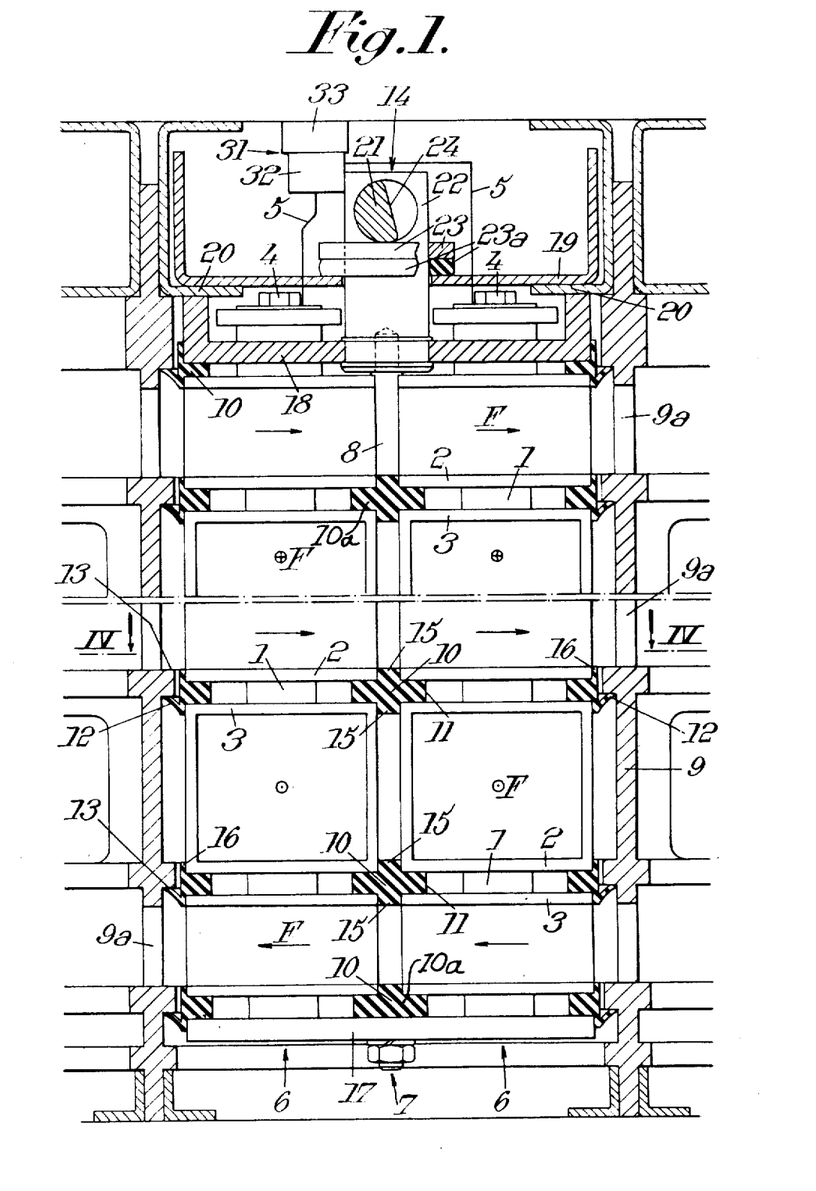
FIG. 1 of these drawings is a section through a thermoelectric installation in conformity with a first mode of embodiment of the invention in which the drawer is shown in its operating position.

In FIGS. 1 to 5 there is illustrated a thermoelectric installation of the type heat pump in which the thermoelements denoted in a general way by the reference figure 1, are fed with d.c. current in order to maintain a temperature difference between the thermal exchange walls 2 and 3 on each side of each thermoelement 1.

These thermal exchange walls 2 and 3 belong to hot exchangers through which a hot fluid circulates and to cold exchangers through which a cold fluid circulates, the direction of circulation of these hot and cold fluids being denoted in FIG. 1 by arrows F.

As concerns the feed of d.c. current to the thermoelements 1 this can be carried out by means of connections 4 supplied through leads 5 and through the intermediary of the heat exchangers which are thus traversed by the electric current which flows through the thermoelements 1.

In the construction of such thermoelectric installations it has already been proposed that they should be designed to include batteries 6 of hot and cold exchangers alternating with the thermoelements 1, the exchanger or exchangers on each side of which the thermoelements are situated not being insulated electrically and being capable of forming a mono-block assembly; these batteries 6 are arranged side by side and electrical connection between the thermoelements is made through the exchangers along a straight line path (assembly in columns).

Nevertheless, according to a variant of this construction the exchanger or exchangers on each side of which the thermoelements are situated may be electrically insulated, the batteries then being imbricated and electrical connection between the thermoelements being made through the base of the exchangers and according to a Greek key pattern path (assembly in bridge form).

In any case and whatever the type of mounting adopted, the batteries of exchangers which are arranged side by side or imbricated, make up a drawer 7 of parallelepipedal appearance in which the thermoelements are arranged in parallel planes and the exchangers are arranged opposite to each other.

The elements which constitute this drawer are connected together by means of attachment such, for example, as a central tie-rod 8 and are protected by a framework 9 within which passages 9a allowing the circulation of the hot and the cold fluid are arranged.

According to the mode of embodiment of the invention illustrated in FIG. 1, a joint 10 is provided at the level of each plane of thermoelements, this joint being constituted by a plate 10a including the same number of apertures 11 as there are thermoelements 1 in said plane, this joint being nipped between the facing walls 2 and 3 of the hot exchanger and the cold exchanger and including, in addition, a peripheral rim 12 in the form of a lip which acts in conjunction with a bearing surface 13 arranged in the framework 9.

Figure 2:
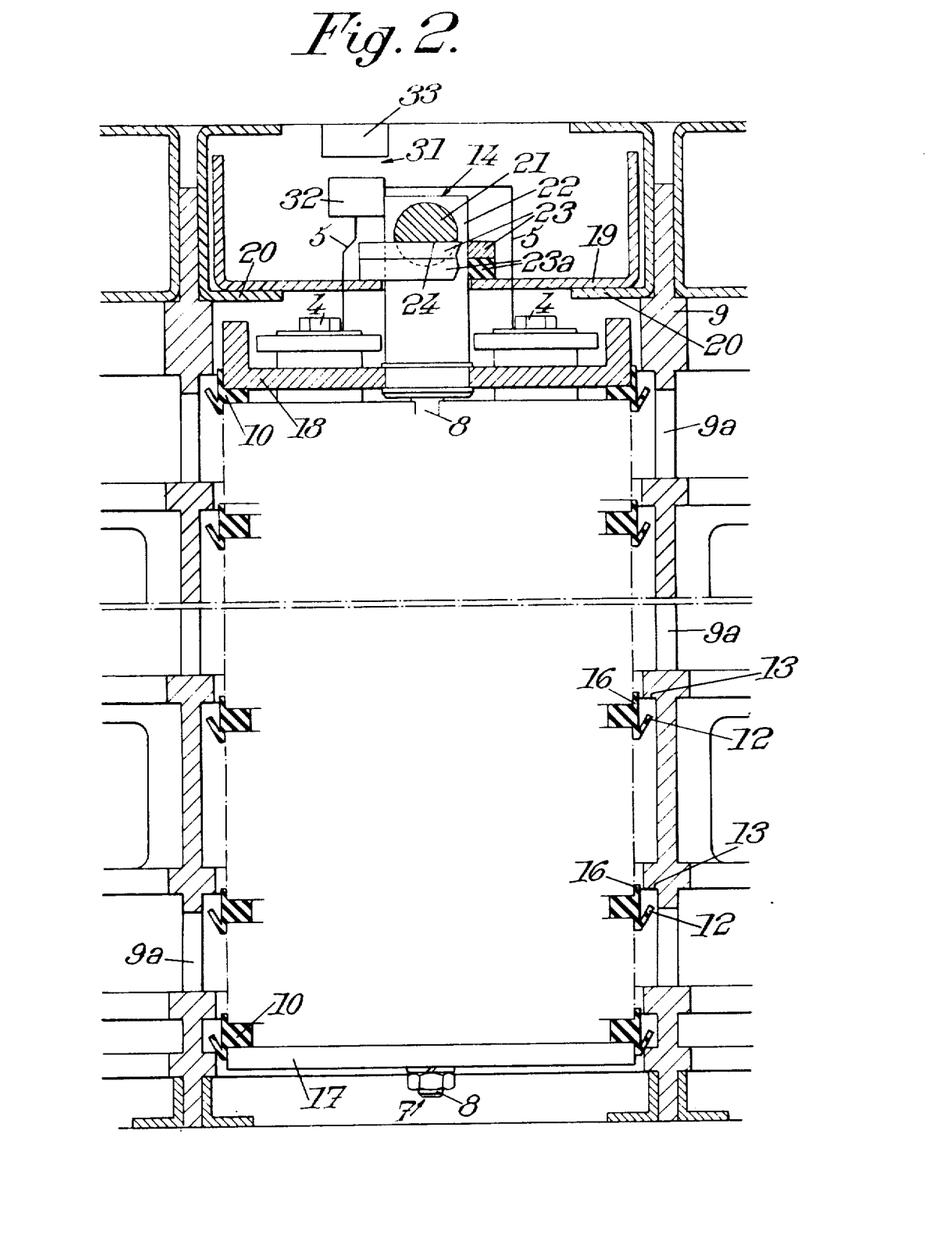
FIG. 2 illustrates the same installation as that of FIG. 1, the drawer being shown in the position for removal.

A displacement mechanism 14 is provided to bring about a relative displacement between the drawer 7 and the framework 9, this relative displacement allowing:

either the making of a sealing contact between the lip 12 of each joint 10 and the corresponding bearing surface 13 of the framework 9 (installation in the operating position as shown in FIG. 1), or the separation of the lip 12 of each joint 10 from the corresponding bearing surface 13 of the framework 9 (drawer 7 in position for removal from the casing 9 as shown in FIG. 2 in which the same reference numbers denote the same organs as in FIG. 1).

Figure 5:
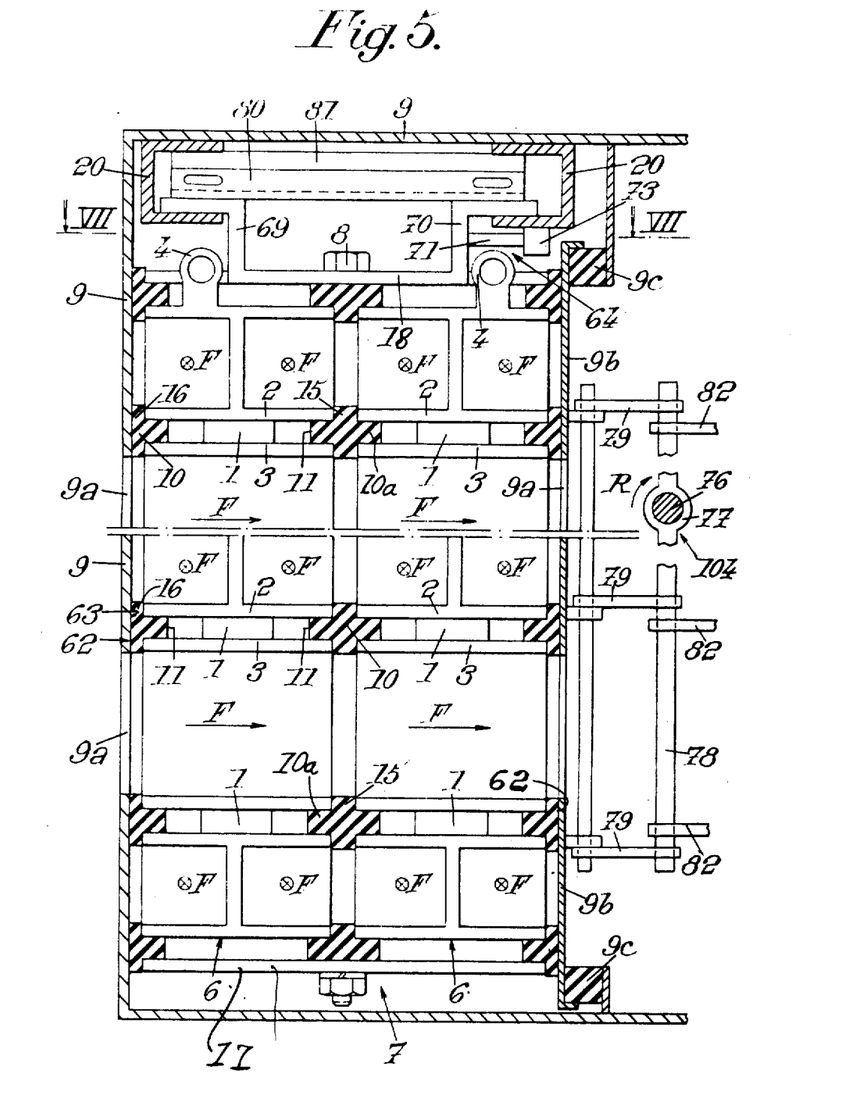
FIG. 5 is a section through a thermoelectric installation in accordance with another mode of embodiment of the invention in which the drawer is shown in its operating position.

According to the mode of embodiment of the invention illustrated in FIG. 5, a joint 10 is provided at the level of each plane of thermoelements, this joint being constituted by a plate 10a including the same number of apertures 11 as there are thermoelements 1 in said plane, said joint being nipped between the facing walls 2 and 3 of the hot exchanger and of the cold exchanger and including, in addition, a peripheral rim 62 acting in conjunction with a bearing surface 63 determined by the framework 9.

Figure 6:
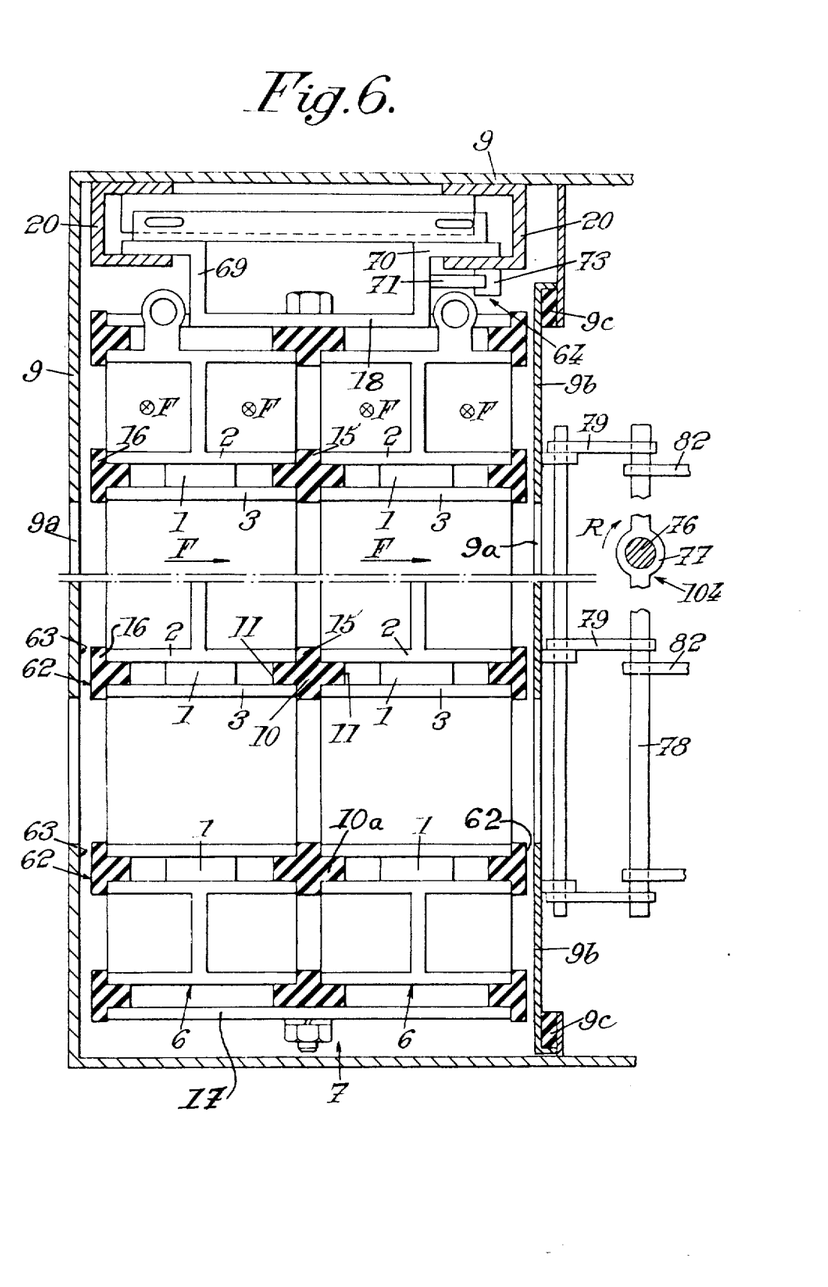
FIG. 6 illustrates the same installation as that of FIG. 5, the drawer being shown in its position for removal.

A displacement mechanism 64 is provided to bring about a relative displacement between the drawer 7 and the framework 9, this relative displacement allowing:

either the making of a sealing contact between the peripheral rim 62 of the joint 10 and the corresponding surface 63 of the framework 9, advantageously with compression of the joint (installation in the operating position shown in FIG. 5).

or the separation of the peripheral rim 62 of each joint 10 from the corresponding bearing surface 63 of the framework 9 (drawer 7 in position to be removed from the framework 9 as shown in FIG. 6 in which the same reference numbers denote the same organs as in FIG. 5).

Each joint 10 may advantageously include, as shown in FIGS. 1, 3, 4, 5, and 6, raised central ribs 15 interposed between the exchangers of the drawer 7 in order, on the one hand, to improve the tightness and, on the other hand, to act as cross-bars ensuring the positioning of the exchangers relative to each other with an effect of springing and of damping of vibrations.

In addition, each joint may advantageously include (FIGS. 1, 3, 4, 5 and 6) a peripheral raised rib 16 which surrounds the periphery of the exchangers arranged on the periphery of the drawer 7.

Of course, the two joints 10 situated at the two extremities of the drawer 7 are arranged differently so as to act in conjunction with two parts 17 and 18 at the extremity respectively, said two parts 17 and 18 being pulled together by the central tie-rod 8.

Figure 3:
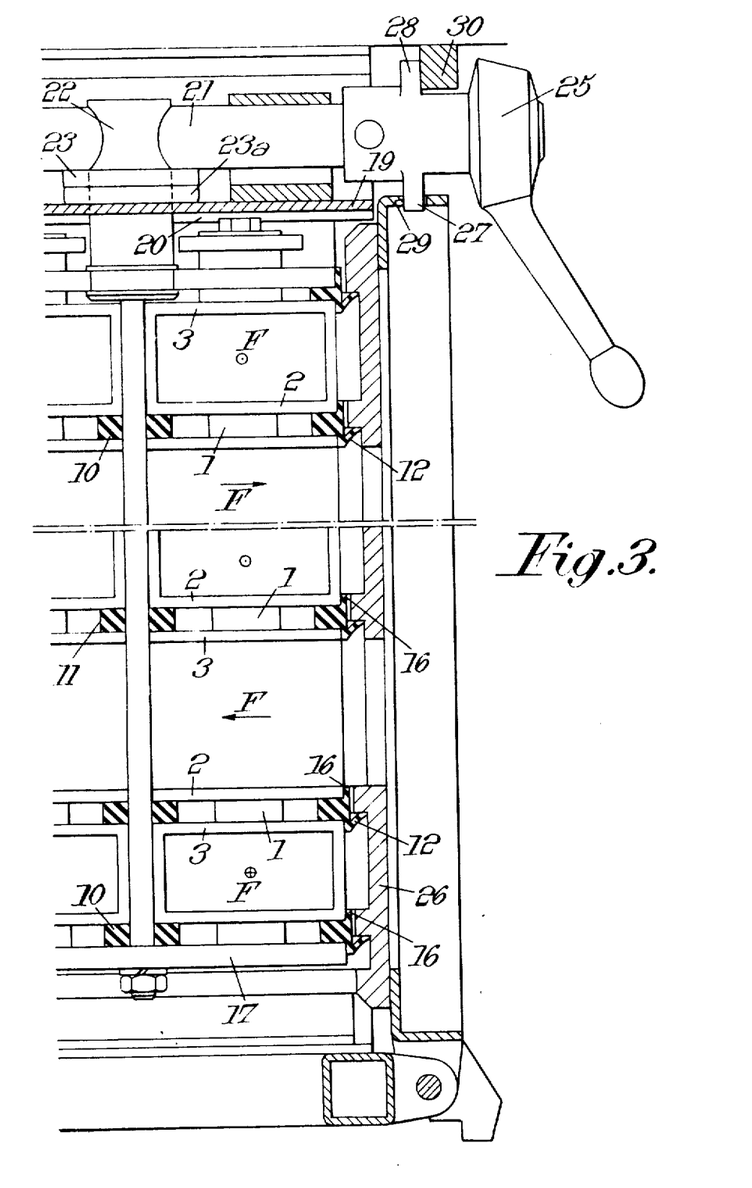
FIG. 3 is a section through another plane showing the installation of FIG. 1, the drawer being shown in its operating position.
Figure 4:
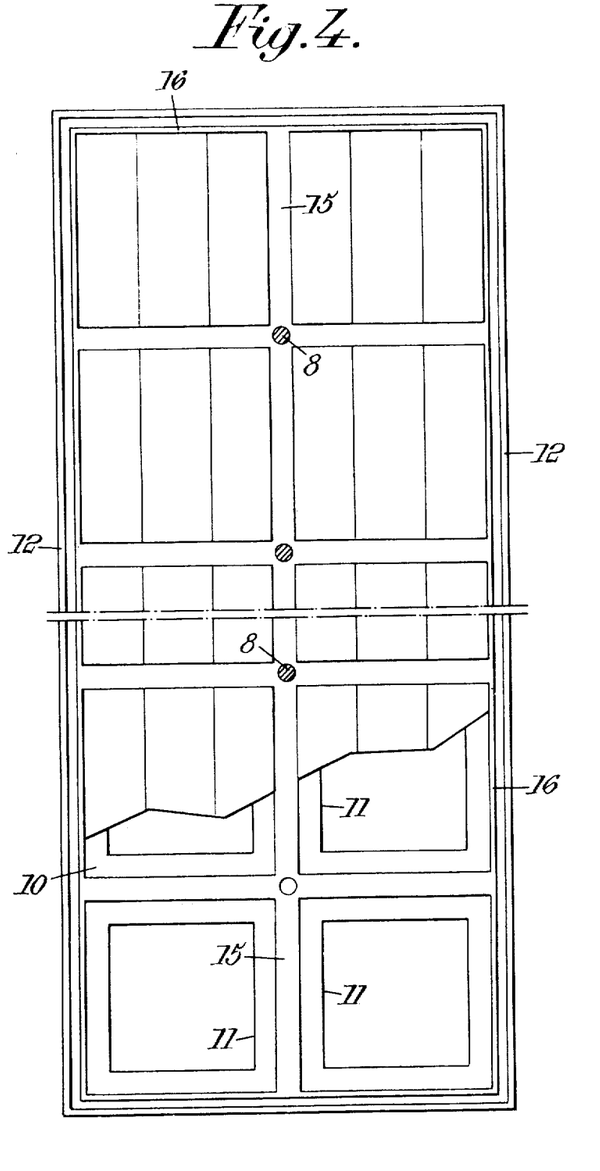
FIG. 4 is a section through a drawer of the installation of FIG. 1, cut along the line IV—IV of FIG. 1.

According to the mode of embodiment of the invention which is illustrated in FIGS. 1 to 3, the drawer 7 is suspended in the upper part of the framework 9 through the intermediary of a supporting part 19, integral with the drawer 7, which rests on two slides 20 integral with the framework 9.

The mechanism of displacement 14 can then advantageously be constituted by a shaft 21 mounted free to rotate in pillow blocks 22 integral with the drawer 7, this shaft 21 resting on at least two stop faces 23 applied against the supporting piece 19; this shaft 21 has, at the level of each of the said stop faces, a flat 24 which may extend as far as the axis of the shaft 21.

The stop faces 23 may then be applied against the supporting piece 19 with the interposition of an elastic part 23a which produces an effect of springing and damping of vibrations. It will then be understood that:

when the shaft rests on the stop surfaces 23 by means of its cylindrical wall, the drawer 7 occupies the high position shown in FIG. 1, and when the shaft 21 rests on the stop surfaces 23 by means of its flats 24, the drawer 7 occupies the low position shown in FIG. 2.

It might be of interest to arrange the upper part of the drawer 7, and particularly the part 18 at the extremity, in such a way that said part 18 at the extremity comes into application against the lower face of the two slides 20 so that the drawer will then become completely immobilised owing to the nipping of the two slides 20 between the supporting piece 19 and the piece 20 at the extremity; in addition, the fact that the piece 18 at the extremity comes into application against the slides 20 limits the upward displacement of the drawer 7 and prevents any accidental deformation of the lips 12 of the joints 10 which might occur if the position of the drawer exceeded a certain limit.

A manipulating organ 25, shown in FIG. 3, allows the shaft 21 to be subjected to a rotational movement between the two positions described below.

According to a constructional arrangement of the invention the shaft 21 also brings about the locking and unlocking of a door 26 closing the side of the framework 9, through which the removal of the drawer 7 is to take piece.

This door 26 is advantageously articulated at the lower extremity of the framework 9 of which it forms one side when in the closed position; said door will then have application rims acting in conjunction with the lip of the corresponding joints and passages allowing circulation of the hot fluid and the cold fluid.

Finally, the shaft 21 can, advantageously, be arranged in such a way as to bring about the locking and unlocking of the drawer 7 in the framework 9 in the sense of the removal of the drawer 7.

In order to achieve this double function (locking and unlocking of the door and locking and unlocking of the drawer) the shaft 21 is designed to include, as shown in FIG. 3, two pins 27 and 28 which come into engagement when the shaft 21 is in the position such that the drawer 7 is in the high position, the one, the pin 27, in front of a ramp 29 produced in the door 26 so as to bring about locking of this door 26 against the framework 9, and the other, the pin 28, behind a ramp 30, integral with the framework 9, to bring about locking of the drawer 7 within the framework 9.

It should also be pointed out that the manipulating organ 25, once operated so as to, on the one hand, move the drawer 7 from its high position to its low position and, on the other hand, to unlock the door 26 and again, finally to unlock the drawer 7, allows the disengagement of the drawer 7 which can then slide freely on the two slides 20 which support the supporting piece 19.

According to another constructional arrangement of the invention there is provided a switching device 31 arranged to command the supply of electric current to the thermoelements when the drawer is in its high position and to cut off the supply of electric current to the thermoelements when the drawer is in its disengaged position.

For this purpose the leads 5 supply the connections 4 abutting on a mobile contact piece 32 integral with the drawer 7 and acting in conjunction with a fixed contact piece 33 integral with the framework 9.

When the drawer 7 is in the high position (FIG. 1) these two contact pieces 32 and 33 are applied one against the other which allows the supply of current to the thermoelements.

On the other hand, when the drawer 7 is in the low position the two contact pieces 32 and 33 are separated from each other which cuts off the current supply to the thermoelements.

Figure 7:
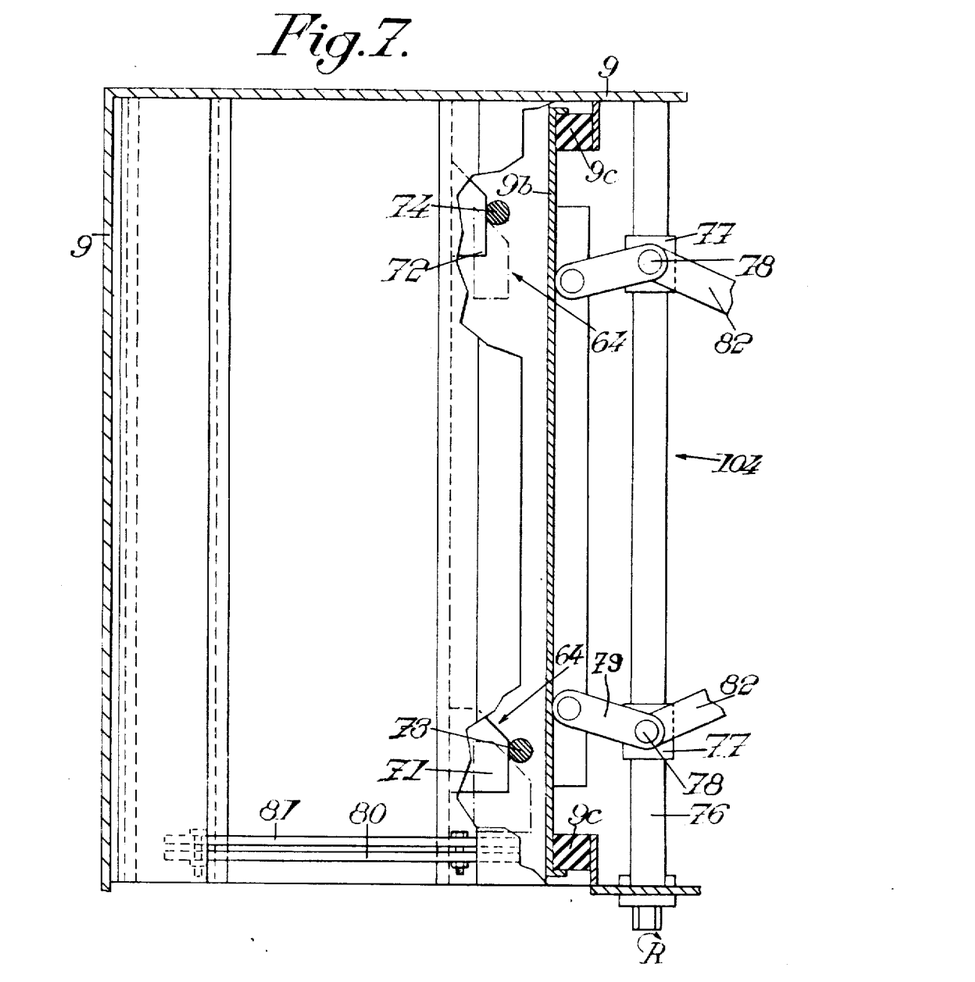
FIG. 7 is a section along the line VII—VII of FIG. 5, with parts hidden.

According to the mode of embodiment of the invention illustrated in FIGS. 5 to 7 the drawer 7 is suspended from the upper part of the framework 9 through the intermediary of two supporting profiles 69 and 70 integral with the part 18 at the extremity which rests on the two slides 20 integral with the framework 9. The lateral movement of translation of the drawer 7 thus takes place parallel to the upper part of the framework 9.

The displacement mechanism 64 may then advantageously be constituted by two cams 71 and 72 carried by the supporting profile 70, each being fitted with an inclined face acting in conjunction with a circular nipple 73-74 carried by the slide 20 corresponding to the supporting profile 70.

Figures 9, 10:
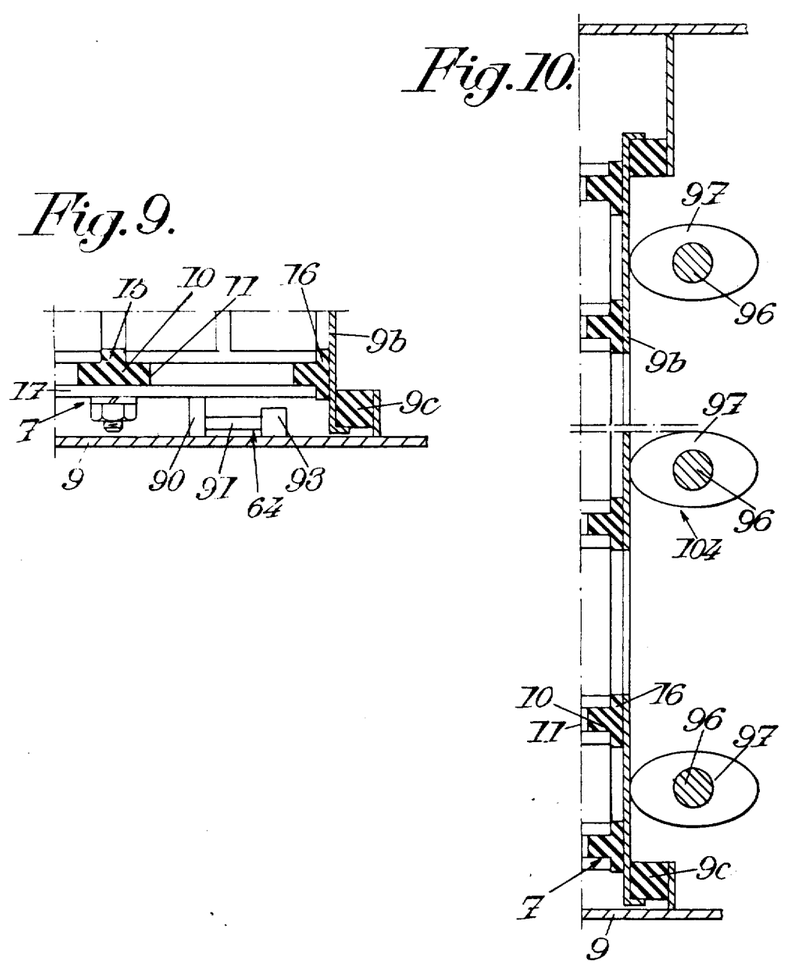
FIG. 9 is a view in partial section along a vertical plane illustrating a variant of the invention.
FIG. 10 is a view in partial section along a vertical plane showing a constructional detail of an installation in accordance with the mode of embodiment of FIG. 5.

According to a variant of the invention illustrated in FIG. 9 in which the same reference numbers denote the same organs as in FIG. 5, the drawer 7 rests on the lower part of the framework 9 through the intermediary of feet 90 integral with the piece 17 at the lower extremity of the drawer 7. The lateral movement of translation of the drawer 7 thus takes place parallel to the lower part of the framework 9. The displacement mechanism 64 is then constituted by two cams 91 carried by the feet 90. These two cams 91 are each fitted with an inclined face acting in conjunction with a circular nipple 93 carried by the lower part of the framework 9.

In addition, the framework 9 is fitted with a displaceable mobile side 9b within which passages 9a to allow circulation of the hot fluid and of the cold fluid are again formed. This mobile side 9b of the framework is connected to the framework by means of a sealing packing 9c.

This mobile side 9b can be displaced by the action of a mechanism 104 which allows it either to be put into sealing contact with the peripheral edge 62 of the joint 10 (installation in operation as shown in FIG. 5) or to be moved away from the peripheral edge 62 of the joint 10 (drawer in position for removal from the framework, as shown in FIG. 6).

The lateral displacement of the mobile side 9b is ensured by a manipulating spindle 76 which is mobile in rotation but rigidly fixed to the framework 9 in translation; this manipulating spindle 76 is threaded over half its length with a left-handed pitch and over the other half with a right-handed pitch. This manipulating spindle carries two screws 77 (one having a right-handed thread and the other a left-handed thread acting in conjunction with the corresponding right-handed and left-handed threads of the manipulating spindle) integral with two spindles 78 parallel to each other, perpendicular to the manipulating spindle 76 and connected to the mobile side 9b of the framework by small connecting rods 79.

Thus when the drawer 7 is replaced in the framework 9 by sliding the supporting profiles 69 and 70 over the slides 20 the cams 71 and 72 come into application on the nipples 73 and 74, respectively, at the end of the installation thus bringing about a lateral displacement of the drawer and thereby leading to application of the peripheral rim 62 of the joints 10 in compression against the bearing surface 63 of the framework 9. Maintenance of the drawer in this advanced position is then ensured by a transverse bar 80 which connects the supporting profiles 69 and 70 and which is bolted to a parallel bar 81 integral with the slides 20. The drawer then occupies the position shown in FIG. 5.

In addition, by rotation of the manipulating spindle 76 in the direction of the arrow R, the screws 77 approach each other along said spindle 76, thus causing a separation between the side 9b and the fixed spindle 76 through the intermediary of the spindles 78 and the small connecting rods 79 in such a way that the side 9b comes into contact with compression of the peripheral rim 62 of the joint 10. The sealing packing 9c between the mobile side 9b and the fixed framework 9 is thus dilated (installation in operation as shown in FIGS. 5 and 7).

On the other hand if it is desired to remove the drawer 7 from the framework 9, the manipulating spindle 76 is caused to turn in the direction opposite to that of the arrow R, causing a separation of the screws 77 and thus of the side 9b relative to the drawer 7, compressing the sealing packing 9c. The bars 80 and 81 are disconnected, then, by sliding the supporting profiles 69 and 70 over the slides 20 the cams 71 and 72 slide on the nipples 73 and 74 in such a way that the drawer 7 performs a lateral movement due to the suppression of compression of the peripheral rims 62 of the joint 10 against the bearing surfaces 63 of the framework 9 (installation out of operation as shown in FIG. 6).

A door, not illustrated, also fitted with passages 9a is mounted to pivot on the framework 9; this door is intended to close the side at which the drawer 7 enters into the framework 9.

According to another form of embodiment shown in FIG. 10 in which the same reference numbers denote the same organs as in FIG. 1, the lateral displacement of the mobile side 9b is ensured by several rotating axles 96, rigidly fixed in translation and carrying cams 97. These rotating axles 96 are controlled simultaneously by a suitable mechanism (not illustrated).

The mounting of a drawer in a framework 9 has been described with reference to FIGS. 5 to 7, but in order to equilibrate the forces exerted on the manipulating spindle 76 it is preferable to have at least two drawers with a corresponding mobile side placed on each side of said spindle 76, the second mobile side being displaced by means of small connecting rods 82, also integral with the spindles 78, during the rotation of the manipulating spindle 76 (these small connecting rods are partly illustrated in FIGS. 5 to 7).

Figure 8:
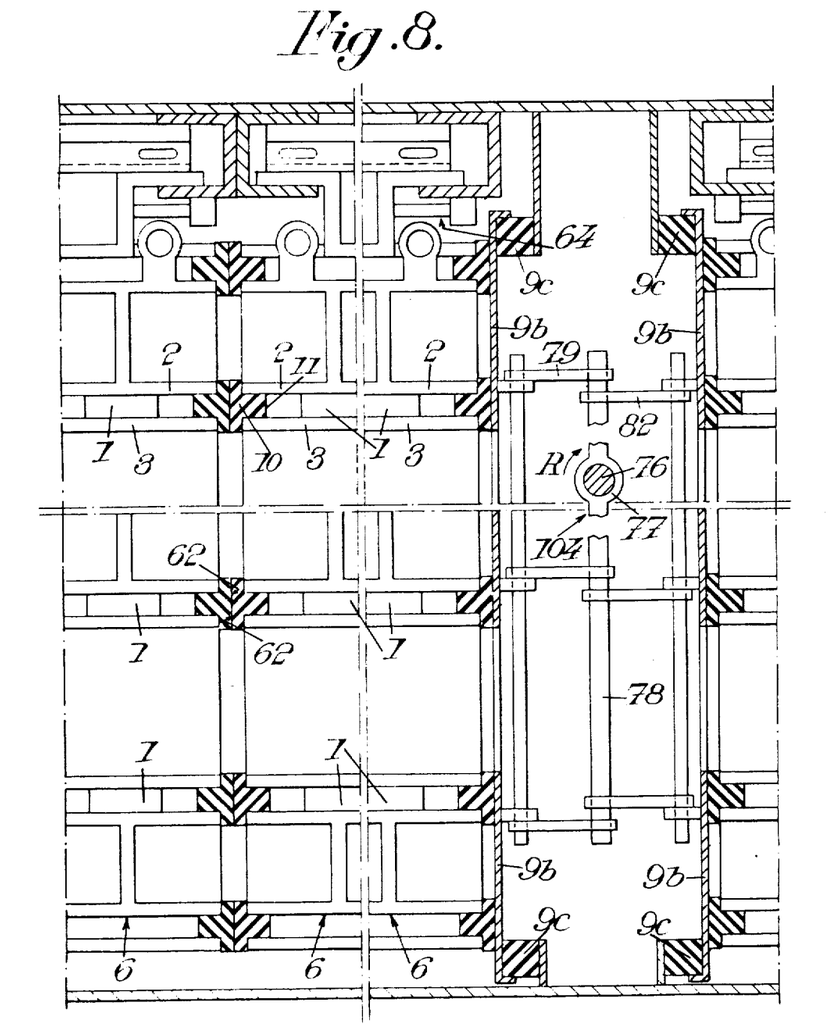
FIG. 8 is a schematic partial view of several drawers side by side in an installation according to FIG. 5, these drawers being shown in their operating position.

It is also possible to place several drawers side by side between the fixed framework and the mobile side 9b, the seal between the drawers being produced by means of the peripheral rims 62 of the corresponding joints 10 of adjacent drawers. The peripheral rims 62 of the joints 10 thus also form the bearing surfaces for the peripheral rims of the joints of the adjacent drawer. Such an arrangement is schematically illustrated in FIG. 8 in which the same reference numbers denote the same organs as in FIG. 5.

Finally it will be understood that there is thus made available a thermoelectric installation in which the seal between the hot fluid and the cold fluid is ensured by reliable and simple means.

In addition, the arrangement of the drawer within its framework makes it possible for the drawer to expand freely.

Finally, the ease of assembly and dismounting of the drawer allows easy maintenance and replacement of the drawer, this operation of dismounting and assembly of the drawer taking place by means of a single control organ.

The present invention thus has a particularly advantageous application in air-conditioning (heating and cooling) of railway carriages which might thus include beneath the chassis a whole series of frameworks each protecting a drawer; it will be understood that in such an application the problems of tightness of the seal, free expansion and ease of assembly and dismounting are particularly important and that the advantages provided by the invention will thus be the more appreciated; in addition the effect of springing and damping of vibrations produced by the joints and the suspension system of the drawers will permit improved resistance of the installation to the conditions of use in railway carriages.

Among the possibilities for the arrangement of the drawer in the framework attention should be drawn to the arrangement such as is illustrated in FIGS. 1 to 4 and 5 to 7 in which the peripheral rim of the joint acts in conjunction with the bearing surface of the framework over its whole length and to the arrangement, such as that shown in FIG. 8, in which the peripheral rim of the joint acts in conjunction with the bearing surface of the framework over part only of its length, the other part acting directly in conjunction with the peripheral rim of the joint of another battery. We claim:

1. In a thermoelectric installation, particularly a heat pump, including thermoelements mounted between thermal exchange walls belonging to hot exchangers through which a hot fluid circulates and cold exchangers through which a cold fluid circulates, said hot and cold exchangers alternating with thermoelements to form batteries arranged side by side or imbricated in such a way as to constitute a drawer of parallelepipedal appearance in which the thermoelements are arranged in parallel planes and the exchangers facing each other, the elements constituting said drawer being held together by means of attachment and protected by a framework, the improvement consisting in a joint provided in each plane of thermoelements, this joint being constituted by a plate including the same number of apertures as there are thermoelements in said plane, this joint being nipped between the facing walls of the hot exchanger and of the cold exchanger and including, in addition, a peripheral rim acting in conjunction over the whole or part of its length with a bearing surface formed in the framework, and a displacement mechanism producing a relative displacement between the drawer and the framework, this relative displace allowing either the putting of the peripheral rim of each joint into sealing contact with the corresponding bearing surface of the framework, with the installation in operation, or separation of the peripheral rim of each joint from the corresponding bearing surface of the framework, with the drawer in position to be removed from the framework.

2. An installation according to claim 1, wherein the displacement mechanism is arranged to cause said drawer to assume either a high position, with the installation in operation, or a low position, with the drawer in position to be disengaged from the framework.

3. An installation according to claim 1, wherein the drawer is suspended from the upper part of the framework.

4. An installation according to claim 1 wherein the peripheral rim of each joint takes the form of a lip.

5. An installation according to claim 1, wherein the displacement mechanism is arranged to cause the drawer to perform a movement of lateral translation.

6. An installation according to claim 5, wherein the drawer is suspended in the upper part of the framework, its movement of lateral translation being parallel to the upper part of the framework.

7. An installation according to claim 5, wherein the drawer rests on the lower part of the framework, its movement of lateral translation being parallel to the lower part of the framework.

8. An installation according to claim 3, wherein the drawer is suspended in the upper part of the framework through the intermediary of a supporting piece integral with said drawer which rests on two slides integral with the framework.

9. An installation according to claim 1, wherein the displacement mechanism is of the cam type.

10. An installation according to claim 9, wherein the cams of the displacement mechanism act in conjunction with nipples.

11. An installation according to claim 10, wherein the cams are carried by the drawer and the nipples by the framework.

12. An installation according to claim 10, wherein the cams are carried by the framework and the nipples by the drawer.

13. An installation according to claim 3, wherein the displacement mechanism includes a shaft mounted with free rotation in pillow blocks integral with the drawer said shaft resting on at least two abutment surfaces and having a flat at the level of each of the two abutment surfaces.

14. An installation according to claim 13, wherein the shaft is arranged, when it is operated, to cause the drawer to ascend or descend and to produce locking or unlocking of a door forming part of the framework and allowing disengagement of the drawer.

15. An installation according to claim 13, wherein the shaft is arranged to produce, when it is operated, to cause the drawer to ascend or descend, and the locking or unlocking of the drawer in the framework in the sense of the disengagement of said drawer.

16. An installation according to claim 6, wherein the drawer is suspended in the upper part of the framework through the intermediary of a supporting piece integral with said drawer and resting on two slides integral with said framework.

17. An installation according to claim 7, wherein the drawer rests on the lower part of the framework through the intermediary of feet.

18. An installation according to claim 5, wherein the framework is fitted with a mobile side connected to the framework by a sealing packing, this mobile side being displaceable under the action of a mechanism which allows either the setting of the mobile side in sealing contact with the peripheral edge of the joint, with the installation in operation, or the separation of the mobile side from the peripheral edge of the joint, with the drawer in the position to be disengaged from the framework.

19. An installation according to claim 1, wherein each joint includes central raised ribs which are interposed between the exchangers.

20. An installation according to claim 1, wherein each joint includes a peripheral raised rib which encloses the exchangers arranged on the periphery of the drawer.

21. An installation according to claim 1, wherein a switching device is arranged to command the supply of electric current to the thermoelements when the drawer is in the position which corresponds to operation of the installation and to cut off the supply of electric current to the thermoelements when the drawer is in its disengaged position.

22. An installation according to claim 1, wherein the exchanger or exchangers on each side of which the thermoelements are situated are not electrically insulated, the batteries being arranged side by side and the electrical connection of the thermocouples to each other taking place through the exchangers on a straight line path.

23. An installation according to claim 1, wherein the exchanger or exchangers on each side of which the thermoelements are situated are electrically insulated, the batteries being then imbricated and the electrical connection of the thermoelements to each other taking place through the base of the exchangers and following a Greek key pattern path.

24. An installation according to claim 1, wherein the peripheral rim of the joint acts in conjunction with the bearing surface of the framework over the whole of its length.

25. An installation according to claim 1, wherein the peripheral rim of the joint acts in conjunction with the bearing surface of the framework over only part of its length.

* * * * *